United States Patent
Gerstenhaber et al.

(10) Patent No.: US 7,545,215 B2
(45) Date of Patent: Jun. 9, 2009

(54) CIRCUIT TO PREVENT LOAD-INDUCED DC NONLINEARITY IN AN OP-AMP

(75) Inventors: Moshe Gerstenhaber, Newton, MA (US); Padraig Cooney, Medford, MA (US)

(73) Assignee: Analog Devices, Inc., Norwood, MA (US)

( * ) Notice: Subject to any disclaimer, the term of this patent is extended or adjusted under 35 U.S.C. 154(b) by 50 days.

(21) Appl. No.: 11/671,103

(22) Filed: Feb. 5, 2007

(65) Prior Publication Data
US 2008/0186098 A1    Aug. 7, 2008

(51) Int. Cl.
*H03F 3/45* (2006.01)
(52) U.S. Cl. ........................ 330/259; 330/252
(58) Field of Classification Search .................. 330/69, 330/252, 257, 259
See application file for complete search history.

(56) References Cited

U.S. PATENT DOCUMENTS

| | | | |
|---|---|---|---|
| 3,440,554 A * | 4/1969 | Graeme et al. | 330/258 |
| 3,444,476 A * | 5/1969 | Leidich | 330/69 |
| 3,551,832 A * | 12/1970 | Graeme | 330/256 |
| 4,172,238 A * | 10/1979 | Kusakabe | 330/259 |
| 5,023,568 A * | 6/1991 | Moore et al. | 330/257 |
| 5,210,505 A * | 5/1993 | Eddlemon | 330/253 |
| 2008/0150502 A1 * | 6/2008 | Migliavacca | 323/281 |

OTHER PUBLICATIONS

Analog devices, Inc. "High Common-Mode Voltage Difference Amplifier" AD629, pp. 1-3, 2000.

* cited by examiner

*Primary Examiner*—Henry K Choe
(74) *Attorney, Agent, or Firm*—Kenyon & Kenyon LLP

(57) ABSTRACT

A circuit for removing non-linearity produced when an amplifier includes a load that results in non-linear current levels is provided. The circuit includes a first transistor element being coupled to one of the differential inputs associated with the amplifier. A second transistor element is coupled to another of the differential inputs associated with the amplifier. The second transistor element is coupled to the current associated with the load. Current passing the collectors of the first and second transistors elements are arranged to be always equal so as to eliminate in the circuit the changes between the base currents of the second transistor element and first transistor element caused by the current associated with the load.

19 Claims, 2 Drawing Sheets

CIRCUIT TO PREVENT LOAD-INDUCED DC NONLINEARITY IN AN OP-AMP

BACKGROUND OF THE INVENTION

The invention relates to the field of operational amplifiers, and in particular to a circuit that prevents load-induced DC non-linearity in an op-amp.

An operational amplifier is a AC or DC-coupled high-gain electronic voltage amplifier with differential inputs and, usually, a single output. In its ordinary usage, the output of the op-amp is controlled by negative feedback which, because of the amplifier's high gain, almost completely determines the output voltage for any given input.

Op-amps are among the most widely used electronic devices today, being utilized in a vast array of consumer, industrial and scientific devices. General-purpose integrated op-amps of standard specification are inexpensive. Modern designs are electronically more rugged than earlier implementations and some can sustain direct short-circuits on their outputs without damage.

The operational amplifier was originally designed to perform mathematical operations by using voltage as an analogue of another quantity. This is the basis of the analog computer where op-amps were used to model the basic mathematical operations (addition, subtraction, integration, differentiation, and so on). However, an ideal operational amplifier is an extremely versatile circuit element, with a great many applications beyond mathematical operations. Practical op-amps, based on transistors, tubes, or other amplifying components and implemented as discrete or integrated circuits, are good approximations to the ideal.

However, once an op-amp includes a load, distortion usually results. One of the ways to accommodate this problem was to provide more current gain to the op-amp. This over time made the op-amp unstable and unpredictable.

SUMMARY OF THE INVENTION

According to one aspect of the invention, there is provided a circuit for removing non-linearity produced when an amplifier includes a load that results in non-linear current levels. The circuit includes a first transistor element being coupled to one of the differential inputs associated with the amplifier. A second transistor element is coupled to another of the differential inputs associated with the amplifier. The second transistor element is coupled to the current associated with the load. Current passing the collectors of the first and second transistor elements are arranged to be always equal so as to eliminate in the circuit the changes between the base currents of the second transistor element and first transistor element caused by the current associated with the load.

According to another aspect of the invention, there is provided a method of removing non-linearity produced when an amplifier includes a load that results in non-linear current levels. The method includes coupling a first transistor element to one of the differential inputs associated with the amplifier. A second transistor element is coupled to another of the differential inputs associated with the amplifier. The second transistor element is coupled to the current associated with the load. Also, the method includes arranging the first and second transistor element so that current passing the collectors of the first and second transistors elements to be always equal so as to eliminate in the circuit the changes between the base currents of the second transistor element and first transistor element caused by the current associated with the load.

DETAILED DESCRIPTION OF THE INVENTION

The invention addresses the issue of non-linearity produced when an amplifier, such as an op-amp, includes a load, which results in high distortion levels.

Figure 1:
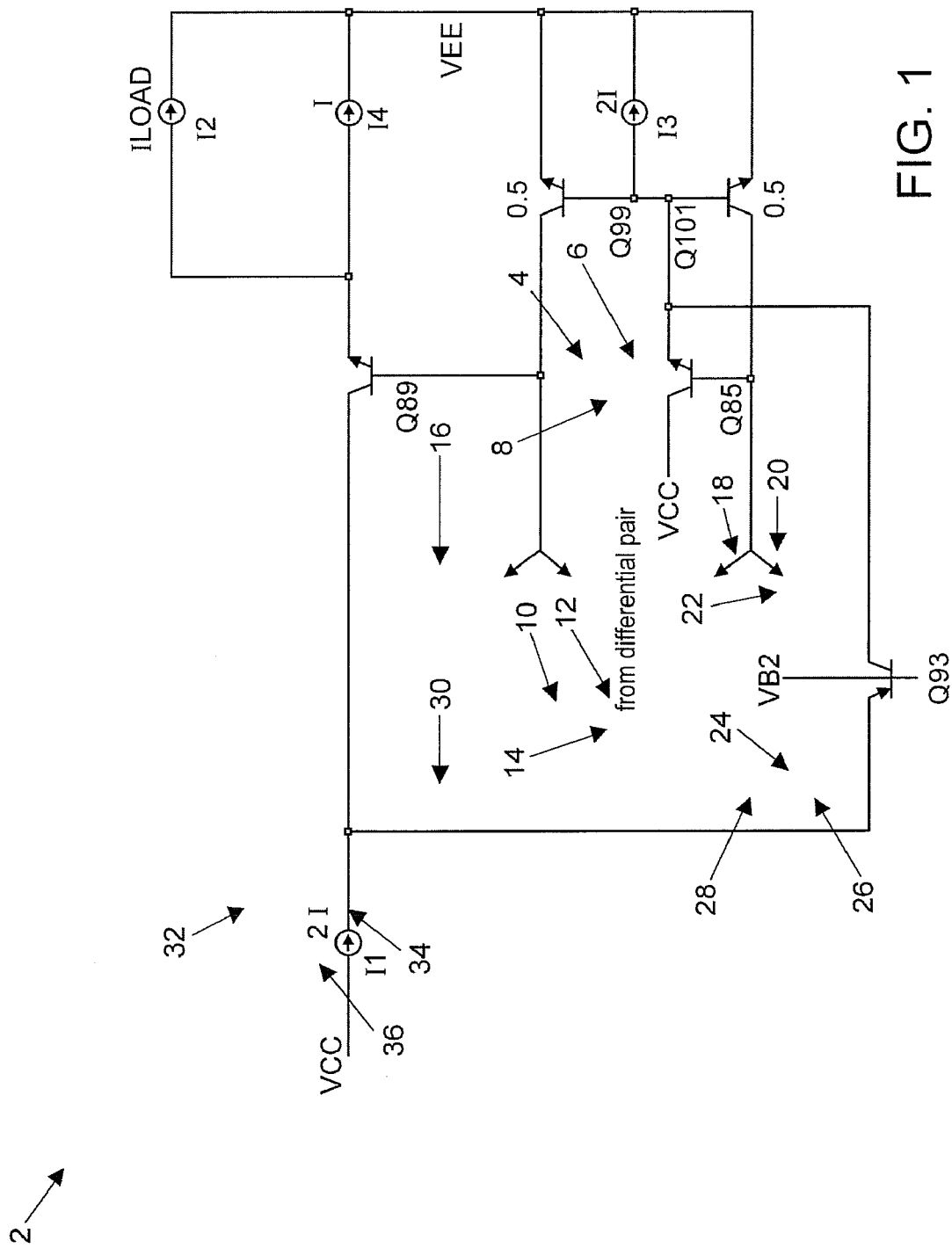
FIG. 1 is a circuit diagram of the invention to remove non-linearity produced when an amplifier includes a load which results in high distortion levels.

FIG. 1 shows a circuit used in DC load-induced nonlinearity cancellation. The circuit includes a current source I1 that provides a current. The current source I1 is coupled to voltage source VCC. A bipolar transistor Q89 is coupled to the current source I1 via its collector 4. The base 8 of transistor Q89 is coupled to one of a first differential pair input port 16 as associated with differential inputs of an op-amp. The emitter 6 of transistor Q89 is coupled to current source I4 and current source I2. Also, both current sources I4 and I2 are coupled to voltage VEE. The collector 18 of transistor Q99 is coupled to the base 8 of transistor Q89.

The emitter 20 of transistor Q99 is coupled to voltage source VEE, and the base 22 of the transistor Q99 is coupled to the base 24 of transistor 101. The emitter 26 of transistor Q101 is coupled to voltage source VEE. The collector 28 of transistor Q101 is coupled to the base 14 of transistor Q85. The base 14 of transistor Q85 is coupled to the second differential input port 30 associated with a second differential input of an op-amp. The collector 10 of transistor Q85 is coupled to voltage VCC, and the emitter 12 of transistor Q85 is coupled to the base 22 of transistor Q99 and base 24 of transistor Q101. A transistor Q93 is a pnp bipolar transistor whose emitter 32 is coupled to the current source I1, and the base 36 of transistor Q93 is coupled to a line VB2. The collector 34 of transistor Q93 is coupled to the emitter 24 of transistor Q85.

A current source I3 is coupled to voltage source VEE and to the base 24 of transistor Q101 and the base 22 of transistor Q99. The current source I3 supplies a current 21. Also, current source I4 supplies a current I and current source I2 supplies a current Iload. The current Iload is associated with the current provided to the load.

The circuit 2 is basically a compensated current mirror. It is assumed that the current Iload and any changes to Iload are small compared to the current I. If this is the case, it can be readily seen that the current passing collectors 4 and 10 of transistors Q85 and Q89 are always equal for all purposes. The effect of the base current changes in the transistor Q89 caused by changes in load are eliminated from the circuit 2 since the base of Q89 is the same.

Figure 2A:
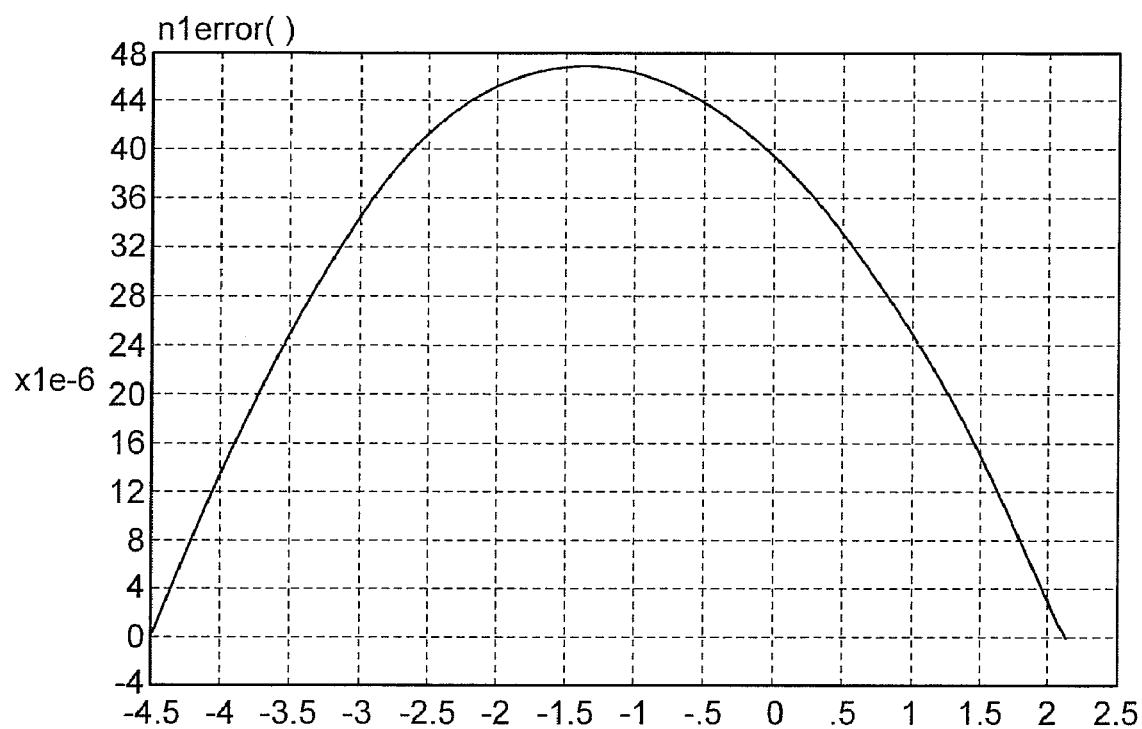
FIGS. 2A-2B are graphs demonstrating the performance of the invention.
Figure 2B:
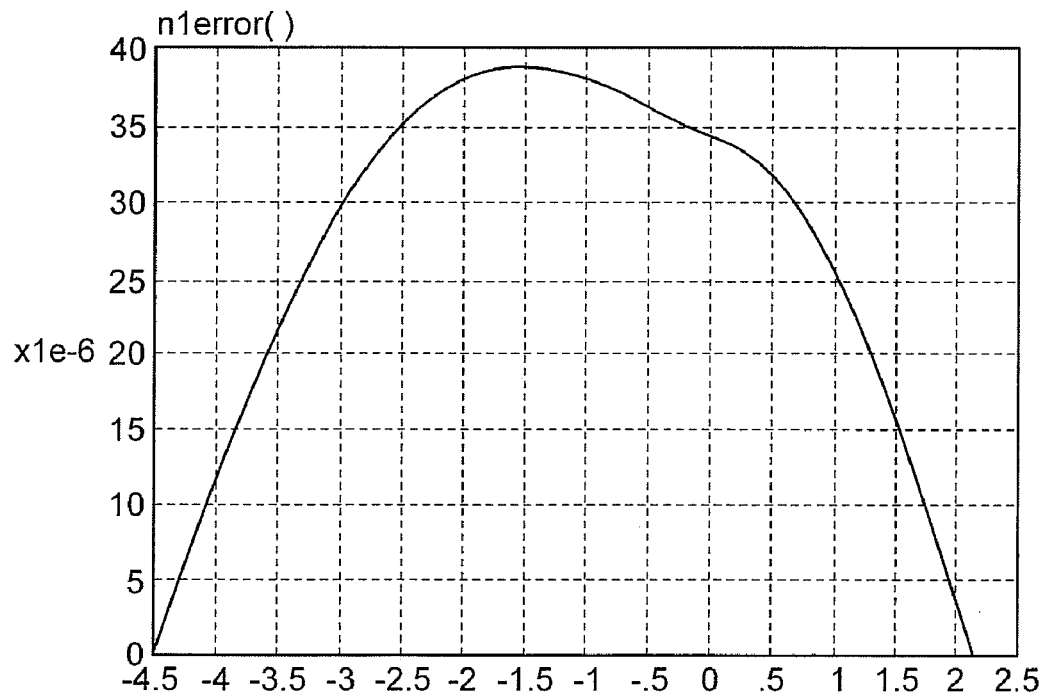

FIGS. 2A-2B are graphs demonstrating the performance of the invention. FIG. 2A shows a graphical representation of when there is no resistance loading the amplifier the behavior of the differential input voltage ve in view of the differential input voltage vinn. FIG. 2B shows a graphical representation of when there is a 2K loading resistance of the amplifier the behavior of the differential input voltage ve in view of the differential input voltage vinn. Note with the 2K load resistance the behavior is substantially similar to that of no load, in other words low DC non-linearity is produced with added loads.

Although the present invention has been shown and described with respect to several preferred embodiments thereof, various changes, omissions and additions to the form and detail thereof, may be made therein, without departing from the spirit and scope of the invention.

What is claimed is:

1. A circuit for removing non-linearity produced when an amplifier includes a load that results in non-linear current levels comprising:
   a first transistor element being coupled to a differential input associated with said amplifier, the base of said first transistor element is coupled to a third transistor element; and
   a second transistor element being coupled to another differential input associated with said amplifier, said second transistor element being coupled to the current associated with said load, the base of said second transistor element is coupled to a fourth transistor element having the same voltage from base to emitter as the third transistor element;
   wherein current passing the collectors of said first and second transistor elements are arranged to be always equal so as to eliminate in said circuit the changes between the base currents of said second transistor element and first transistor elements.

2. The circuit of claim 1, wherein said first transistor element comprises a bipolar transistor.

3. The circuit of claim 1, wherein said second transistor element comprises a bipolar transistor.

4. The circuit of claim 3, wherein the emitter of said second transistor element is coupled to the current associated with said load.

5. The circuit of claim 3, wherein the base of said first transistor element is coupled to said one of the differential inputs.

6. The circuit of claim 3, wherein the base of said second transistor element is coupled to said another of the differential inputs.

7. The circuit of claim 3, wherein the collector of said second transistor element is coupled to a first current source.

8. The circuit of claim 3, wherein the emitter of said second transistor element is coupled to a second current source.

9. The circuit of claim 3, wherein the emitter of said first transistor element is coupled to a third current source.

10. A method of removing non-linearity produced when an amplifier includes a load that results in non-linear current producing levels comprising:
    coupling a first transistor element coupled to a differential input associated with said amplifier;
    coupling the base of the first transistor element to a third transistor element;
    coupling a second transistor element to another differential input associated with said amplifier, said second transistor element being coupled to the current associated with said load;
    coupling the base of said second transistor element to a fourth transistor element having the same voltage from base to emitter as the third transistor element; and
    arranging said first and second transistor elements so that current passing the collectors of said first and second transistors elements are always equal so as to eliminate in said circuit the changes between the base currents of said second transistor element and first transistor element caused by the current associated with said load.

11. The method of claim 10, wherein said first transistor element comprises a bipolar transistor.

12. The method of claim 10, wherein said second transistor element comprises a bipolar transistor.

13. The method of claim 12, wherein the emitter of said second transistor element is coupled to the current associated with said load.

14. The method of claim 12, wherein the base of said first transistor element is coupled to said one of the differential inputs.

15. The method of claim 12, wherein the base of said second transistor element is coupled to said another of the differential inputs.

16. The method of claim 12, wherein the collector of said second transistor element is coupled to a first current source.

17. The method of claim 12, wherein the emitter of said second transistor element is coupled to a second current source.

18. The method of claim 12, wherein the emitter of said first transistor element is coupled to a third current source.

19. A circuit for removing non-linearity produced when an amplifier includes a load that results in non-linear current levels comprising:
    a first transistor element being coupled to a differential input associated with said amplifier, the base of said first transistor element being coupled to a third transistor element; and
    a second transistor element being coupled to another differential input associated with said amplifier, said second transistor element being coupled to the current associated with said load and a second current circumventing the load, the base of said second transistor element being coupled to a fourth transistor element having the same voltage from base to emitter as the third transistor element;
    wherein current passing the collectors of said first and second transistor elements are arranged to be always equal so as to eliminate in said circuit the changes between the base currents of said second transistor element and first transistor element.

* * * * *